United States Patent [19]
Bidnyy et al.

[11] Patent Number: 5,554,856
[45] Date of Patent: Sep. 10, 1996

[54] CONVEYER-TYPE UNIT FOR RADIATION STERILIZATION

[75] Inventors: Sergei V. Bidnyy, Moscow; Alexander A. Zavadtsev, Reutov; Emmanuel A. Mirochnik, Moscow; Alexander V. Mishchenko, Moscow; Vitaly M. Pirozhenko, Moscow; Igor V. Radchenko, Moscow, all of Russian Federation

[73] Assignee: Biosterile Technology, Inc., Fort Wayne, Ind.

[21] Appl. No.: 327,619

[22] Filed: Oct. 24, 1994

[30] Foreign Application Priority Data

Nov. 1, 1993 [RU] Russian Federation ............. 93049760

[51] Int. Cl.$^6$ .................................................. H01J 37/20
[52] U.S. Cl. .................. 250/455.11; 250/453.11; 250/442.11; 250/400; 250/492.3
[58] Field of Search ........................... 250/455.11, 492.1, 250/492.3, 453.11, 454.11, 441.11, 442.11, 400

[56] References Cited

U.S. PATENT DOCUMENTS

| | | | |
|---|---|---|---|
| 3,714,592 | 1/1973 | Jory . | |
| 3,780,308 | 12/1973 | Nablo | 250/493.1 |
| 4,139,774 | 2/1979 | Katagiri | 250/441.11 |
| 4,383,178 | 5/1983 | Shibata et al. | 250/441.11 |
| 4,652,763 | 3/1987 | Nablo | 250/492.3 |
| 4,891,516 | 1/1990 | Balter | 250/455.11 |
| 5,126,571 | 6/1992 | Sakai | 250/442.11 |
| 5,338,940 | 8/1994 | Takeyama | 250/400 |

OTHER PUBLICATIONS

Gerald E. Hare. "IMPELA Electron Accelerators for Industrial Radiation Processing." *Radiation Physics and Chemistry*. vol. 35, 1990, pp. 619–626.

"Radiation Physics and Chemistry", vol. 35, Nos. 1–3, pp. 357–360, 1990.

"Accelerator Requirements for Electron Beam Processing", R. C. Becker et al., pp. 353–375, 1979.

"Radiation Physics and Chemistry", vol. 15, pp. 99–106, 1980.

"Guideline for Electron Beam Radiation Sterilization of Medical Devices", American National Standard, 1990.

Iotron Industries Canada, Inc., marketing information brochure.

*Primary Examiner*—Jack I. Berman
*Assistant Examiner*—Kiet T. Nguyen
*Attorney, Agent, or Firm*—George Pappas

[57] ABSTRACT

A radiation sterilization conveyor unit for sterilizing biological products, prolonging shelf life of food stuff, decontamination of clinical waste and decontamination of microbiological products. A power unit, modulator, and an ultra-high frequency generator are connected via microwave waveguide elements to an electron injector, accelerator and beam scanning system. The injector, accelerator and beam scanning system are located in shielding made of cast iron or lead. A disk-shaped transporter is provided and extends in part in a cavity in the shielding. Products to be irradiated are placed on the disk-shaped transporter and the transporter is selectively rotated for placing the products in the field of accelerated electrons. The shielding and transporter block dangerous levels of ionizing radiation.

21 Claims, 1 Drawing Sheet

CONVEYER-TYPE UNIT FOR RADIATION STERILIZATION

TECHNICAL FIELD

The invention concerns the field of accelerator technology, specifically the technology of high frequency charged particle accelerators. It can be used for sterilization of instruments in clinics, sterilization of products in medical industry plants, for prolonging the shelf life of foodstuffs, for the decontamination of clinical waste, for microbiological production, and so forth.

BACKGROUND OF THE INVENTION

Various designs of electron accelerators with shielding from braking radiation are used for radiation sterilization. All the well-known sterilization units are designed for commercial batch sterilization production are located in special rooms where concrete walls up to 2.8 m thick serve as shielding. Such sterilization installations are large in size, heavy, and costly. They are unsuitable for use in clinical conditions, small-scale production, or laboratories.

Some known sterilization units are described in the following references:

1. "Accelerator Requirements for Electron Beam Processing." R. C. Becker et al. *Radiation Physics and Chemistry.* Vol. 14, 1979, pp. 353–375.

2. William J. Maher. "The Application of Electron Beam Equipment for Sterilization of Medical Devices." *Radiation Physics and Chemistry.* Vol. 15, 1980, pp. 99–106.

3. Gerald E. Hare. "IMPELA Electron Accelerators for Industrial Radiation Processing." *Radiation Physics and Chemistry.* Vol. 35, 1990, pp. 619–626.

Of the well-known sterilization units, the closest with respect to technical characteristics is the IMPELA unit based on the standing wave linear accelerator, which is selected as the prototype. The accelerating system, injector, micro-wave waveguide system, vacuum system, and beam scanning system are mounted on a special platform in this unit and located in a separate room with concrete walls. This installation possesses all of the above enumerated deficiencies.

SUMMARY OF THE INVENTION

The objective of the invention is to reduce the overall dimensions, weight, and cost of the unit.

The objective is achieved because the conveyer unit for radiation sterilization of medical products and foodstuffs contains the transporter, the unit for biological shielding from ionizing radiation, and the linear electron accelerator, which includes the accelerating section, injector, beam scanning system, micro-wave waveguide elements, ultra-high frequency generator, modulator, power unit, and control unit. The transporter is in the shape of a disk which rotates around the vertical axis. In addition, the biological shield is formed from the units embracing the accelerating section, the injector, the beam scanning system, and the transporter.

The conveyer unit for radiation sterilization of medical products and foodstuffs consists of the transporter, the biological shielding unit from ionizing radiation, and the linear electron accelerator which includes the accelerating section, injector, bean scanning system, micro-wave waveguide system, ultra-high frequency generator, modulator, power supply, and control unit. The unit is different because the transporter is made in the shape of a disk which rotates around the vertical axis and the biological shielding is made up of units which embrace the accelerating section, the injector, the beam scanning system, and the transporter.

DESCRIPTION OF SPECIFIC EMBODIMENT

Figure 1:
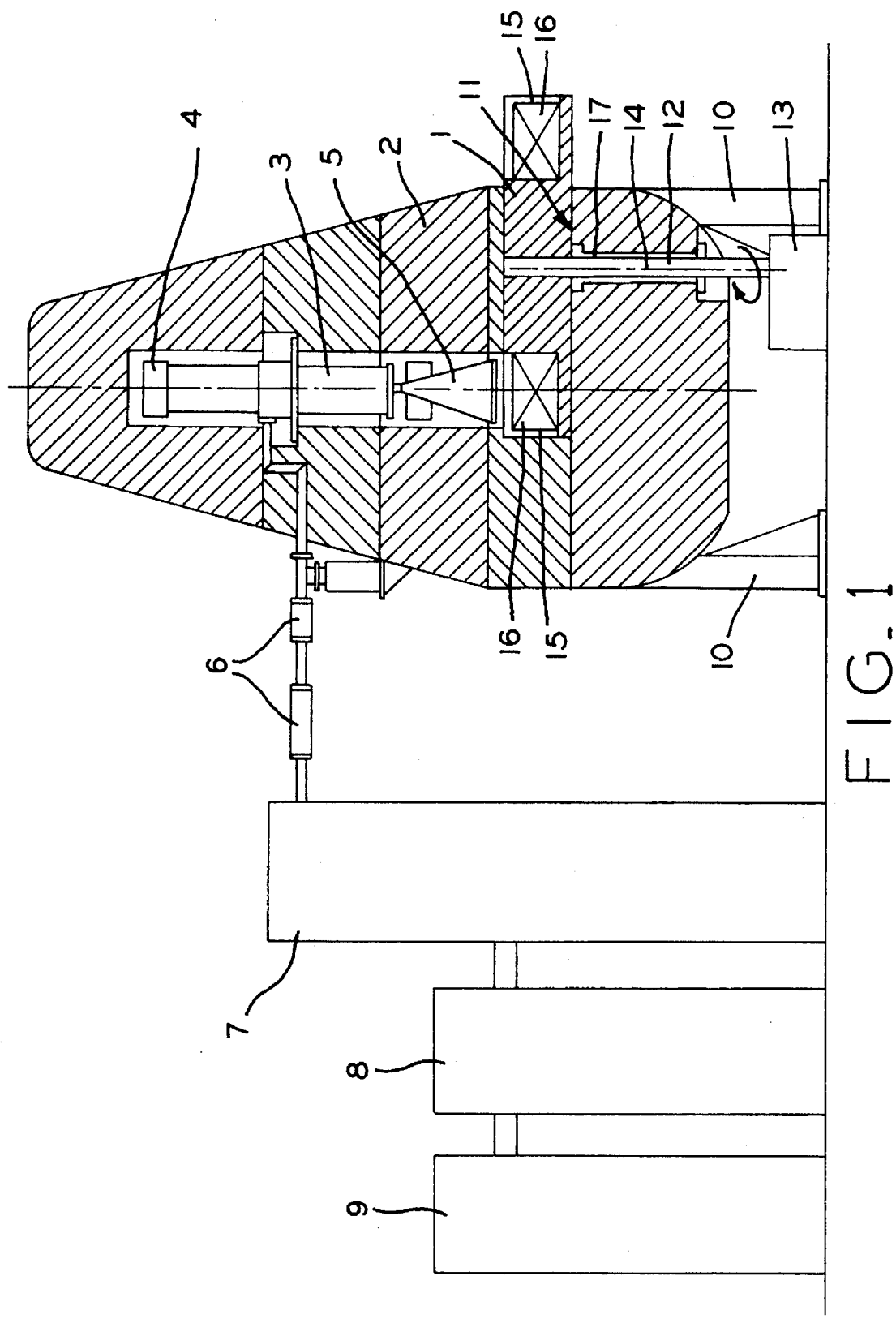
FIG. 1 is a diagrammatic cross-sectional view showing a conveyer-type unit for radiation sterilization incorporating a rotating transporter according to the present invention.

The proposed unit is depicted in FIG. 1. The unit includes the rotating generally disk-shaped transporter 1, the unit for biological shielding from ionizing radiation 2, the accelerating section 3, the injector 4, the beam scanning system 5, micro-wave waveguide elements 6, the ultra-high frequency generator 7, the modulator 8, and the power unit 9. As shown in FIG. 1, the biological shielding is made up of separate units or sections which embrace or surround the injector 4, the accelerating section 3, the beam scanning system 5 and the transporter 1. Together, shielding 2 and transporter 1 prevent dangerous levels of ionizing radiation from exiting the unit during use. As shown, legs 10 are provided for supporting shielding 2 along with transporter 1, injector 4, accelerating section 3, and beam scanning system 5.

As also shown in FIG. 1, the disk-shaped transporter 1 is received within a tightly fitting cavity 11 and a shaft 12 is coaxially aligned and affixed to the disk-shaped transporter 1. A bore 17 is provided through shielding 2 and shaft 12 extends therethrough and out of shielding 2. A rotation means 13 is provided outside of shielding 2 and is coupled to shaft 12 for selectively rotating shaft 12 and disk-shaped transporter 1 about the vertical axis 14. Transporter 1 is provided with recesses or pockets 15 whereat products 16 to be irradiated are loaded. As shown in FIG. 1, pockets or recesses 15 are located on the periphery of disk-shaped transporter 1 and are located about 180 radial degrees from each other. The radial thickness between the pockets 15 which serves as shielding from ionizing radiation is approximately as thick as, for example, the shielding surrounding beam scanning system 5. In this fashion, dangerous levels of ionizing radiation is prevented from exiting through cavity 11.

The unit operates in the following manner. Products 16 to be irradiated are loaded onto the rotating disk-shaped transporter 1 on or in one of the pockets or recesses 15. Transporter 1 is then selectively rotated about axis 14 for passing products 15 under the beam scanning system 5. Pulsating voltage from the modulator 8 is supplied to the ultra-high frequency generator 7 and injector 4. In the accelerating section 3, ultra-high frequency oscillations are generated by the ultra-high frequency generator 7 accelerating electrons which are injected by the injector 4. The beam of accelerated electrons is scanned by the scanning system 5 in a radial line for the transporter 1 on which rest the products 16 being radiated. The products 16 are sterilized in the field of the beam of accelerated electrons as transporter 1 is rotated placing products 16 in the beam of scanned accelerated electrons. During this sterilization, dangerous levels of ionizing radiation are prevented from exiting the unit by shield 2 and transporter 1.

In comparison with the prior art, the proposed design solution has the following advantages. The biological shielding system can be made in the form of a lead or cast iron thick wall container in which the accelerating section, the injector, and the scanning system is installed, and in which the transporter is mounted. Consequently, the proposed unit has considerably smaller overall dimensions and biological shielding system mass than the prior art in which the accelerator is located in a special room with concrete walls up to 2.8 m thick. The result of this is less cost of capital construction of the unit.

A unit for the sterilization of medical instruments with 4 Mev accelerated electron energy, accelerated electron beam power of 2 kw, and transporter rotation velocity of 0.1 rev/min provides an example of specific production. The performance of such a unit, with allowance made for loading and unloading, consists of 100 kg/hr. Overall dimensions of the unit are 2.0×2.0×2.5 m and mass of 14 tons.

What is claimed is:

1. A radiation sterilization apparatus comprising:
   an electron injector;
   an electron accelerator coupled to said injector;
   an electron beam scanning system coupled to said accelerator for directionally scanning accelerated electrons;
   shielding surrounding said injector, accelerator and scanning system for blocking radiation;
   a cavity in said shielding; and,
   a selectively rotatable transporter received in part in said cavity and communicating in part outside of said shielding whereby products to be irradiated are placed in the field of accelerated electrons by rotation of said transporter.

2. The apparatus of claim 1 wherein said transporter is disk-shaped.

3. The apparatus of claim 2 wherein said disk-shaped transporter includes a recess at its periphery thereof whereat products to be irradiated are placed.

4. The apparatus of claim 3 wherein said disk-shaped transporter is rotated about a generally vertically situated axis.

5. The apparatus of claim 2 wherein said disk-shaped transporter includes two recesses at the periphery thereof whereat products to be irradiated are placed.

6. The apparatus of claim 1 wherein said transporter is rotated about a generally vertically situated axis.

7. The apparatus of claim 1 wherein said transporter is disk-shaped and includes a recess at its periphery thereof whereat products to be irradiated are placed, and further comprising a shaft connected to said disk-shaped transporter and means for selectively rotating said shaft whereby said shaft and disk-shaped transporter are rotated.

8. The apparatus of claim 7 wherein said shaft is coaxially aligned with said disk-shaped transporter.

9. The apparatus of claim 7 wherein said shaft is generally vertically situated and said shaft and disk-shaped transporter are rotated about a generally vertical axis of rotation.

10. The apparatus of claim 9 wherein said rotating means is located outside of said shielding and said shaft extends through a bore in said shielding.

11. The apparatus of claim 7 wherein said rotating means is located outside of said shielding and said shaft extends through a bore in said shielding.

12. The apparatus of claim 1 further comprising a shaft having a longitudinal axis connected to said transporter and means for selectively rotating said shaft about said axis, whereby said shaft and transporter are rotated.

13. The apparatus of claim 12 wherein said shaft is generally vertically situated and said shaft and transporter are rotated about a generally vertical axis of rotation.

14. The apparatus of claim 12 wherein said rotating means is located outside of said shielding and said shaft extends through a bore in said shielding.

15. The apparatus of claim 1 wherein said shielding is made up of separate units, a first unit embracing said injector, a second unit embracing said accelerator, a third unit embracing said scanning system, and a fourth unit in part embracing said transporter.

16. The apparatus of claim 15 wherein said shielding is made of materials selected from a group consisting of lead or cast iron.

17. The apparatus of claim 15 wherein said transporter is disk-shaped and includes a recess at its periphery thereof whereat products to be irradiated are placed, and further comprising a shaft connected to said disk-shaped transporter and means for selectively rotating said shaft, whereby said shaft and disk-shaped transporter are rotated.

18. The apparatus of claim 15 further comprising a shaft having a longitudinal axis connected to said transporter and means for selectively rotating said shaft about said axis, whereby said shaft and transporter are rotated.

19. The apparatus of claim 1 wherein said shielding is made of materials selected from a group consisting of lead or cast iron.

20. The apparatus of claim 1 further comprising a power unit, a modulator coupled to said power unit, and an ultra-high frequency generator coupled to said modulator and feeding impulse voltage to said injector, accelerator, and beam scanning system through said shielding with microwave waveguide elements.

21. The apparatus of claim 1 wherein said rotatable transporter has a radial thickness approximately as thick as said shielding, whereby said transporter blocks dangerous levels of radiation from exiting through said cavity.

* * * * *